(12) United States Patent  
Maneatis et al.

(10) Patent No.: US 7,634,039 B2  
(45) Date of Patent: Dec. 15, 2009

(54) DELAY-LOCKED LOOP WITH DYNAMICALLY BIASED CHARGE PUMP

(75) Inventors: John George Maneatis, Los Altos, CA (US); Jaeha Kim, Mountain View, CA (US); Daniel Karl Hartman, Littleton, MA (US)

(73) Assignee: True Circuits, Inc., Los Altos, CA (US)

( * ) Notice: Subject to any disclaimer, the term of this patent is extended or adjusted under 35 U.S.C. 154(b) by 517 days.

(21) Appl. No.: 11/347,835

(22) Filed: Feb. 3, 2006

(65) Prior Publication Data

US 2006/0193419 A1 Aug. 31, 2006

Related U.S. Application Data

(60) Provisional application No. 60/649,948, filed on Feb. 4, 2005.

(51) Int. Cl.
*H03D 3/24* (2006.01)

(52) U.S. Cl. ..................................................... 375/376

(58) Field of Classification Search ................. 375/375, 375/376; 331/17; 327/149, 158
See application file for complete search history.

(56) References Cited

U.S. PATENT DOCUMENTS

| 6,437,619 | B2 * | 8/2002 | Okuda et al. ................. 327/158 |
| 6,970,029 | B2 | 11/2005 | Patel et al. |
| 7,071,746 | B2 * | 7/2006 | Suda et al. ................... 327/158 |
| 7,292,106 | B2 * | 11/2007 | Maneatis ....................... 331/17 |
| 2002/0097592 | A1 * | 7/2002 | Komurasaki et al. ......... 363/157 |
| 2002/0101289 | A1 * | 8/2002 | Maneatis ....................... 331/17 |
| 2005/0110548 | A1 * | 5/2005 | Suda et al. ................... 327/277 |
| 2007/0164797 | A1 * | 7/2007 | Law et al. .................... 327/149 |

* cited by examiner

*Primary Examiner*—Chieh M Fan  
*Assistant Examiner*—Jaison Joseph  
(74) *Attorney, Agent, or Firm*—Alleman Hall McCoy Russell & Tuttle LLP (57) ABSTRACT

A delay-locked loop, including a phase detector configured to receive two signals, one of the signals being delayed relative to the other of the signals, the phase detector having an UP output and a DOWN output. The delay-locked loop also includes a charge pump system operatively coupled with the phase detector, the charge pump system including (1) a charge pump configured to be responsive to assertion of actuating signals from the UP output and the DOWN output so as to control pumping of charge from the charge pump system, such pumped charge being usable to control a delay line carrying one of the two signals, so as to control relative delay occurring between the two signals; and (2) a feedback control loop configured to dynamically adjust at least one bias signal at the charge pump so as to minimize net charge pumped from the charge pump system during simultaneous assertion of actuating signals from the UP output and the DOWN output.

22 Claims, 10 Drawing Sheets

DELAY-LOCKED LOOP WITH DYNAMICALLY BIASED CHARGE PUMP

CROSS-REFERENCE TO RELATED APPLICATION

This application is based upon and claims the benefit under 35 U.S.C. § 119(e) of the following U.S. provisional patent application, which is incorporated herein by reference in its entirety for all purposes: U.S. Provisional Patent Application Ser. No. 60/649,948 entitled MASTER/SLAVE ANALOG DLL WITH LOW JITTER, filed Feb. 4, 2005.

TECHNICAL FIELD

This disclosure relates to Delay-Locked Loops (DLLs), and in particular to the reduction of jitter, duty cycle distortion, and static phase offset in DLLs.

BACKGROUND

DLLs have many applications. For example, frequency-multiplying DLLs can be used to generate high frequency clocks from low frequency clocks. Deskew DLLs can be used to phase align a distributed clock to a reference clock. Master/slave DLLs can be used to delay arbitrary signals by precise fractions of a clock period.

Because DLLs often must produce large delays, they may also add proportionally large jitter (random variations in delay) to the signal delayed. Such jitter is usually undesirable, and so techniques for reducing jitter are valuable.

Another result of the large delays in the delay line is significant differences in the propagation time of low-to-high versus high-to-low edges. These differences show up as duty cycle distortion, or more accurately named pulse width distortion, at the output of the DLL, and are also undesirable.

In addition, DLLs often suffer from inaccuracies in the control system that aligns the delayed reference clock edge with an undelayed edge. Any inaccuracy in this alignment is called static phase offset. Static phase offset leads to inaccuracies in the delayed edge timing, which are undesirable.

DETAILED DESCRIPTION OF THE INVENTION

Figure 1:
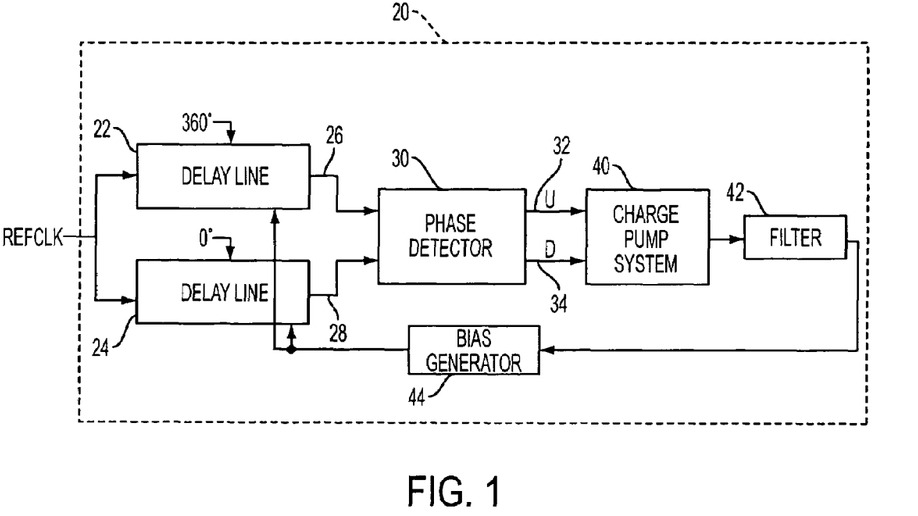
FIG. 1 is a block diagram of a delay-locked loop (DLL) system according to the present description.

FIG. 1 depicts an embodiment 20 of a delay-locked loop (DLL) according to the present description. DLL 20 includes delay lines 22 and 24, configured to receive an input reference signal, such as REFCLK. Outputs 26 and 28 of the delay lines 22 and 24 are respectively coupled to phase detector 30. Phase detector 30 may include UP and DOWN outputs 32 and 34, as will be explained in more detail, which may be applied as inputs to control operation of charge pump system 40. Charge pump system 40 pumps charge (e.g., provides a momentary output current) based on application of the UP and/or DOWN signals. The pumped charge is used to provide feedback to control delay lines 22 and 24, optionally with additional processing by filter 42 and bias generator 44, in order to control operation of the delay lines. When operating in lock, the control system of the DLL described keeps the delay of individual delay elements fixed through variations in the operating environment, such as temperature and voltage fluctuations. According to an example discussed below, the fed back input to the delay lines is a voltage or current which controls how much the respective delay lines delay the incoming reference signal. Typically this voltage or current is implemented as a biasing signal applied to delay elements in the delay line, so as to control the speed of the delay elements.

Figure 2:
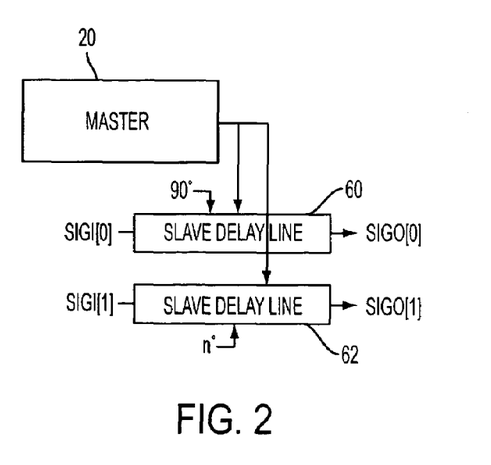
FIG. 2 is a block diagram of a DLL application involving slave delay lines.

FIG. 2 shows an exemplary embodiment in which one or more slave delay lines 60 and 62 are provided, and controlled based on output from a DLL, such as the DLL of FIG. 1. In such a scheme, the DLL of FIG. 1 may be considered to include master delay lines (e.g., lines 22 and 24), while the specifically depicted delay lines in FIG. 2 would be considered slave delay lines. Any number of slave delay lines may be employed to provide varying delay controlled by the closed-loop controlled delay of the master loop. In particular, the slave section includes one or more delay lines which use controls from the master section to delay an arbitrary signal (e.g., the signals shown applied through the slave delay lines 60 and 62) by some precise fraction of the reference clock period. In different implementations, the fraction may be fixed or may be programmable. For example, in Double Data Rate (DDR) memory applications, it is often desired that the slave delay lines have a delay that is one quarter the master delay which is locked to a reference clock period.

DLL delay lines, whether master or delay, typically are composed of multiple delay elements. The amount of signal delay provided in a given line may be controlled by varying the delay of the individual delay element(s) and/or by selecting a number of delay elements which will be operative or activated. In other words, the more delay elements that are activated, the longer the signal will be delayed, because it travels through a greater number of delay elements before being output. Additionally, or alternatively, the speed or delay of various types of delay elements may be controlled by varying control voltages or currents applied to the delay elements (e.g., such as a regulated supply voltage that drives logic gates in the delay elements).

Figure 3:
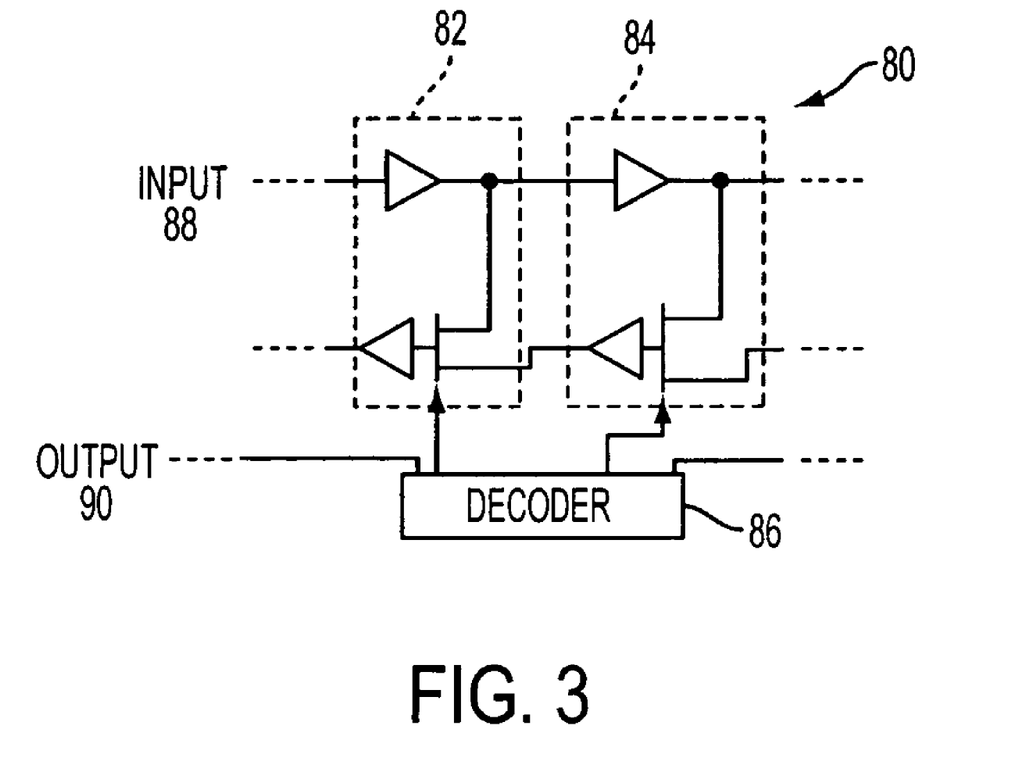
FIG. 3 is a schematic diagram of a delay line.

Varying the number of delay elements can be used to lock the delay line based on the reference clock and/or to replicate a scaled version of a delay. FIG. 3 shows an example of a delay line 80 including two delay elements 82 and 84. Two elements are included for clarity of explanation only; it should be understood that delay lines commonly include many more elements, depending on the particular application or intended use. Continuing with the present example, in each delay line element, the lower multiplexor leg may be called the "feed-forward" leg, and the upper multiplexor leg may be called the "wrap" leg.

Decoder 86 may be arranged so that, from the left, the multiplexors in each delay element are switched to their feed-forward legs until one multiplexor is switched to its wrap leg. As explained below, decoder 86 provides control over how many delay stages (i.e., elements) are activated within delay line 80, and thus over how much delay is introduced by the delay line.

Continuing with the example of FIG. 3, the signal to be delayed travels from input 88, through potentially many buffer stages to the right, until it comes to the multiplexor which passes it through the wrap leg. The buffer stages passed up to this point may be referred to as the "input chain". At that point it passes through potentially many buffer stages until it passes to the output. The buffer stages after the multiplexor which wraps the edge are the "output chain." The control signal from decoder 86 thus controls how many buffers the signal to be delayed must travel through to reach output 90.

The master delay lines and other components of FIG. 1 typically are configured so that the difference in delay between delay lines 22 and 24 is one clock period of the reference signal. This includes controlling the relative delay introduced by delay lines 22 and 24. As indicated above, this delay adjustment can be done through adjusting the delay of each element, and/or by varying the number stages in the delay line.

Continuing with the figure, delay line 22 is adapted so that it delays the reference clock signal by one cycle, as indicated in the figure (360°). This may be achieved by beginning with an initial approximation and subsequent adjustment, by empirically selecting a delay amount at design time, by selectively trying different numbers of delay elements, etc. Delay line 24 is adapted so that it delays the signal by some minimum amount. In practice, delay line 24 provides some minimum (non-zero) amount of delay, such that this amount typically is accounted for in the delay of delay line 22. In other words, whatever the minimum delay of line 24, delay line 22 typically is adapted to provide an additional delay in the amount of one clock period.

Although the present examples primarily discuss a master loop employing two delay lines, other configurations may be employed. For example, instead of a 0° delay line (line 24), the reference signal (REFCLK) may be applied directly to the phase detector. In another example, a match cell is employed in addition to or instead of the 0° line. Indeed, except where otherwise indicated, the present disclosure is applicable to a variety of settings in which two signals are applied to a phase detector for purposes of generating feedback control to control delay occurring between the two signals.

The advantage of using two delay lines in the master loop is that the reference clock period is locked to the delay difference between them. This makes it possible to program the slave delay line to delay a signal by a precise fraction of the reference cycle, relative to a match cell.

Phase detector 30 typically is configured to compare each reference edge (from delay line 24) to the previous reference edge delayed by one cycle (from delay line 22). If the delayed reference edge is early, the delay line is too fast, so the phase detector produces a proportionally long DOWN pulse. If the delayed reference edge is late, the delay line is too slow, so the phase detector produces a proportionally long UP pulse. The UP and DOWN outputs 32 and 34 cause the amount and sign of the charge pumped to vary, which in turn causes the delay elements in lines 22 and 24 to run faster or slower, so as to bring the current and delayed edges coming out of the delay lines into alignment. For example, the UP signal 32 may be pulsed when the delayed edge is lagging, thereby increasing the speed of the delay elements and reducing the relative delay of the delayed edge. Conversely, the DOWN signal 34 may be pulsed to increase delay in the event that the delayed edge is ahead of the current edge.

Typically, phase detector 30 is configured to pulse both UP and DOWN outputs when current and delayed edge are aligned, or nearly aligned (e.g., in lock). For example, a range of offsets around absolute lock may be selected in which both UP and DOWN outputs are pulsed. As discussed below, this may eliminate or reduce a "dead band" in which the system does not tightly control or maintain lock when the current and delayed edges are in lock or nearly in lock. When a dead band is present, there may be jitter or slightly varying phase offsets between the edges that are to be aligned. In many cases, this diminished control is undesirable.

Charge pump system 40 receives the UP and/or DOWN outputs from phase detector 30 and produces a pumped charge output proportional to the pulse width on the UP or DOWN outputs for loop filter 42. Other implementations may include producing a fixed charge rather than a proportional charge in response to phase differences between the reference and delayed signals output from delay lines 22 and 24.

Loop filter 42 may be implemented with a loop filter capacitor that stores the current delay value as the control voltage. This voltage is proportional to the time integral of the error charge signal from the charge pump.

Bias generator 44 may be adapted to create a regulated supply voltage VVdd for driving the delay lines 22 and 24, and other system components. Typically the regulated supply voltage is less than the block supply voltage, and is constant and independent of changes to the block supply voltage. This regulated supply voltage is used to power the master delay lines (e.g., lines 22 and 24). According to one example, bias generator 44 receives the control voltage and creates a regulated supply voltage, related or equal to the control voltage, that is used to directly control the delay of the master delay lines. According to another example, a constant supply voltage is based on some other constant voltage, such as a band gap voltage, and a separate method is used to control the delay of the delay line based on the control voltage.

According to another embodiment, a digital DLL scheme may be employed, in which a digital up/down counter is employed instead of analog charge pump system 40 and loop filter 42. The counter is responsive to pulses from phase detector 30, so as to digitally control the bias generator and/or vary the number of stages in the delay line (with or without using a bias generator).

Assuming that the delay line has sufficient delay range, and that the control loop is properly damped, the master loop described in connection with FIG. 1 is adapted to converge on a state in which delay line 22 delays the reference clock by one reference cycle, or in the case of non-negligible delay in delay line 24, by one reference cycle more than the delay occurring in line 24.

It will be appreciated that the described DLL system may be employed in a variety of settings. Some examples, as above, involve a delay between lines 22 and 24 of one reference cycle. Other exemplary settings may be configured for different amounts of delay.

The following are exemplary applications for the DLL of FIG. 1:

Example 1: In a deskew DLL, delay line 22 delays by less than one cycle, with its output feeding a clock distribution. One end point of that clock distribution may be the input to phase detector 30.

Example 2: In a frequency-multiplying DLL, the output of delay line 22 is multiplexed back into its own input. In such an exemplary topology, a clock pulse may be circulated through the delay line multiple times before arriving at phase detector 30.

Example 3: In a master/slave DLL (referring also to FIG. 2), the master DLL of FIG. 1 may be used to drive one or more slave delay lines. In the analog example of FIG. 1, a control voltage, either from loop filter 42 or bias generator 44, is applied from the master DLL to drive one or more slave delay lines 60, 62, etc. In this example, the control voltage controls the speed of the delay elements in the slave delay lines (thus controlling the delay). Additionally or alternatively, a control signal may be employed to vary the number of operative delay elements in the slave lines. In either case, a digital control of the slave delay line can then select a delay equal to a precise fraction of the master loop's delay.

Figure 4:
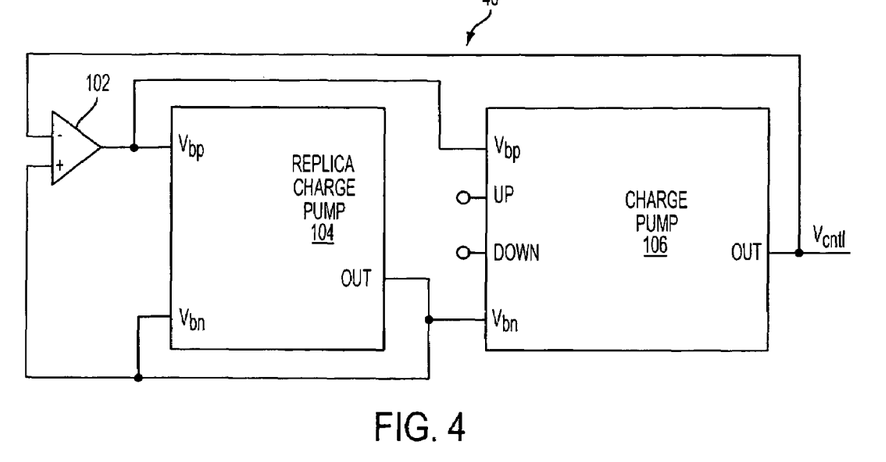
FIG. 4 is a schematic block diagram showing a charge pump system according to the present description.
Figure 5:
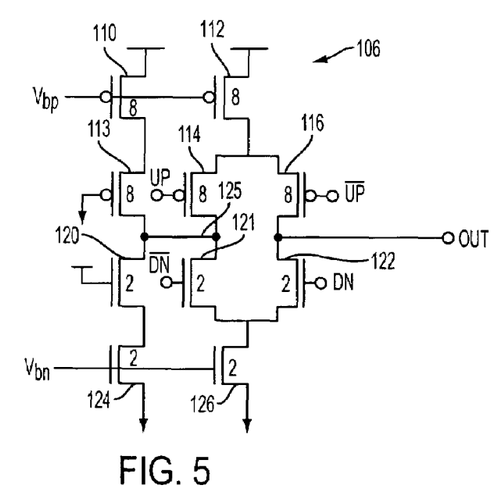
FIG. 5 is a schematic circuit diagram of a charge pump embodiment that may be employed with the charge pump system of FIG. 4.
Figure 6:
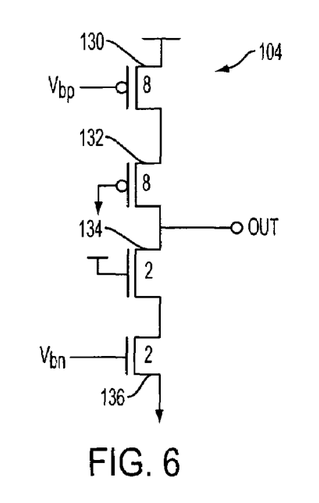
FIG. 6 is a schematic circuit diagram of a charge pump replica embodiment that may be employed with the charge pump system of FIG. 4.
Figure 7:
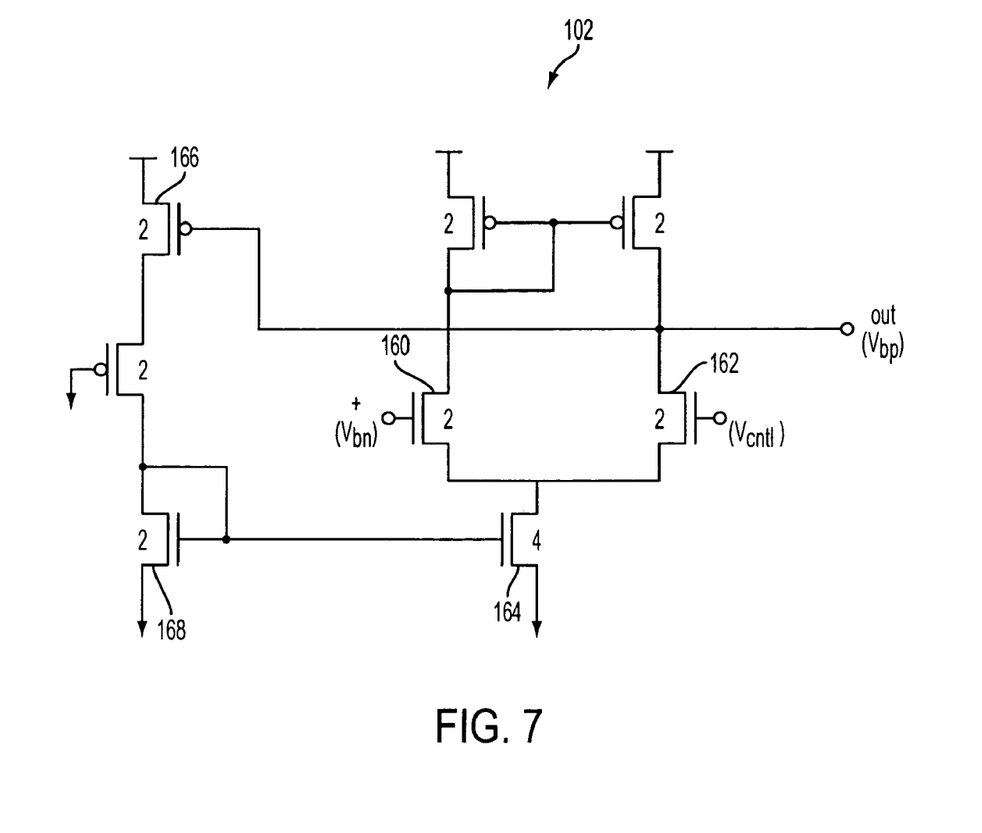
FIG. 7 is a schematic circuit diagram of an amplifier embodiment that may be employed with the charge pump system of FIG. 4.

Referring now to FIGS. 4-7, an exemplary embodiment of charge pump system 40 will be described. Charge pump system 40 may include a differential amplifier 102 and a charge pump replica stage 104, as well as the actual charge pump stage 106. Charge pump 106 includes UP and DOWN charge pump inputs (e.g., received from phase detector 30), and a charge pump output, which may be stored as a control voltage Vcntl via a capacitor, loop filter or other mechanism. Replica charge pump 104 includes a replica charge pump output. In FIGS. 5-7, exemplary relative device widths are indicated adjacent the gate of the depicted transistors. It should be appreciated that various alternate device sizes and configurations are possible, and that the present depictions are exemplary only. The depicted sizes/configurations may provide certain advantages. For example, the depicted sizes/configurations may ensure that the NMOS differential pair devices in the amplifier stay in saturation for all possible Vctrl voltages. These ratios are highlighted in the charge pump figures and will be explained below.

Both replica charge pump 104 and charge pump 106 include first biasing inputs tied to the same value, designated in the figures as Vbp. Vbp may also be referred to as the PMOS bias voltage of the exemplary charge pump system 40. In typical exemplary operational settings, Vbp is slightly below (e.g., 200 mV) a supply or block voltage Vdd of the system, or other upper rail voltage or reference.

In addition, replica charge pump 104 and charge pump 106 include second biasing inputs, which are also tied to the same value, designated in the figures as Vbn. Vbn may also be referred to as the NMOS bias voltage of the exemplary charge pump system 40. In typical exemplary operational settings, Vbn is slightly above (e.g., 200 mV) a substrate voltage Vss, or other ground or lower rail or reference voltage.

In the depicted example, the charge pump output (e.g., Vcntl) is coupled in a feedback arrangement to the negative terminal of differential amplifier 102. The output of replica charge pump 104 is fed back to the positive terminal of the amplifier, and is also tied to the Vbn bias inputs of the replica charge pump and charge pump. The output of the differential amplifier is coupled to the Vbp bias inputs of charge pump 106 and charge pump replica 104.

Charge pump 106 is responsive to signals applied to its UP and DOWN charge pump inputs. As previously discussed, UP and/or DOWN signals may be asserted in response to phase offset detection performed by phase detector 30. Typically, assertion of the UP input causes a net positive charge to be pumped to charge pump output (Vcntl), thereby resulting in a higher control voltage or bias applied to delay lines 22 and 24, thus causing a change in the relative delay between the lines (e.g., a reduction in the delay). Delay line 22 typically has more activated delay elements than line 24, so speeding up the individual delay cells/elements in each line causes a relative reduction in delay between the two lines. Conversely, assertion of the DOWN input pumps a net negative charge, producing a lower control voltage causing the bias to change so that the delay of the lines is increased. This feedback arrangement produces control in which the compared edges coming out of the delay lines tend toward and are maintained in a state of alignment.

As previously discussed, phase detector 30 is typically configured to have no dead band, such that when the compared edges received at the phase detector inputs are aligned (or nearly so, such as within a pre-defined range or percentage of the reference period), both the UP and DOWN outputs are asserted briefly each cycle. In such a case, charge pump system 40 is configured so that substantially no net charge is pumped from the charge pump output. To achieve this, the charge pump must be appropriately biased at bias inputs Vbp and Vbn to ensure that substantially no net charge is pumped upon simultaneous assertion of the UP and DOWN signals at the inputs of charge pump 106. The feedback coupling of charge pump 106 and charge pump replica 104, along with operation of differential amplifier 102, causes the charge pump system to automatically and dynamically self-bias. As will be shown, this dynamic self-biasing operation produces a bias condition (e.g., a setting of bias levels Vbp and Vbn) of the charge pump which causes the charge pump to produce no net charge during simultaneous assertion of the UP and DOWN signals.

Referring now to FIG. 5, an exemplary embodiment of charge pump 106 is depicted. The exemplary charge pump includes PMOS transistors 110, 112, 113, 114, 116 and NMOS transistors 120, 121, 122, 124 and 126. Transistors 110 and 112 are configured to operate in saturation mode as current sources biased by Vbp. Transistors 124 and 126 are also configured to operate in saturation mode as current sources, but biased by Vbn. Between biased current sources 112 and 126 are two parallel branches, the first being a series transistor stack including transistors 114 and 121, with the other branch being a series stack including transistors 116 and 122. Between biased current sources 110 and 124 is a series stack including transistors 113 and 120. Transistors 113, 120, 114, 121, 116 and 122 are operated as switches, with the following gate connections:

transistor 113: Vss
transistor 120: Vdd
transistor 114: UP (e.g., from phase detector)
transistor 121: DOWN inverted (e.g., from phase detector)
transistor 116: UP inverted
transistor 122: DOWN The output of the charge pump is taken between devices 116 and 122. Charge is pumped to/from the output based on bias levels Vbp and Vbn, and in response to the state of the UP and DOWN signals. The accumulated charge at the charge pump output (e.g., as stored at loop filter capacitor 42) may be referred to as the control voltage Vcntl.

For example, upon assertion of UP (with DOWN remaining unasserted), transistor 116 is switched on to conduct, while transistor 122 remains off. A positive net charge driven by current source 112 is then pumped to the output. As previously discussed, this increased charge can produce an increased control voltage to vary (e.g., decrease) the relative amount of signal delay in delay lines 22 and 24.

Similarly, upon assertion of DOWN (with UP remaining unasserted), transistor 116 remains off, and transistor 122 is switched on to conduct. Biased current source 126 then draws charge off from the output (i.e., a negative net charge is pumped). The resulting decreased charge at the output may be used to slow down the delay lines and thereby increase the relative amount of delay between the lines (e.g., to bring the signals into alignment).

Upon simultaneous assertion of both UP and DOWN, current is permitted to flow through transistors 116 and 122. As previously discussed, the charge pump system may be configured to dynamically generate biasing levels Vbp and/or Vbn so as to equalize currents flowing through transistors 116 and 122. In this bias condition, substantially no net charge is pumped to the charge pump output, thereby reducing or eliminating static phase offset in the alignment of signals coming out of delay lines 22 and 24.

The same bias condition that causes simultaneous assertion of UP and DOWN to pump no net charge through OUT also causes net 125 to settle at a voltage approximately equal to Vcntl. Transistors 113 and 120 are both always on, and transistors 110 and 124 are biased to produce the same currents. Due to the finite impedance of current sources 110 and 124, net 125 settles to a voltage approximating Vcntl.

When UP is deasserted, current from transistor 112 is switched to net 125, where it is harmlessly dumped through transistors 120 and 124. Similarly, when DOWN is deasserted, current from transistor 126 is also dumped into net 125. Because one of transistors 114 and 116 is always on, and one of transistors 121 and 122 is always on, transistors 112 and 126 have constant current flow to relatively unvarying voltages, so that the response of the charge pump to the pulse width of the UP and DOWN signals is more nearly linear. Better linearity reduces jitter while in lock.

Referring now to FIG. 6, an exemplary embodiment of replica charge pump 104 is depicted. Replica charge pump 104 includes a PMOS current source transistor 130 biased by Vbp; a PMOS switch transistor 132 with its gate tied to Vss; an NMOS switch transistor 134 with its gate tied to Vdd; and an NMOS current source transistor 136 biased at its gate by Vbn.

Typically, transistor devices 130, 132, 134 and 136 are matched to transistor devices 112, 116, 122 and 126, respectively, of charge pump 106. For example, the transistor devices may be of the same type, width/geometry, etc. Charge pump replica 104 thus replicates a current path of charge pump 106, namely, the path through transistors 112, 116, 122 and 126 when the UP and DOWN signals are simultaneously asserted.

Amplifier 102 may be implemented in a variety of different ways. Typically, amplifier 102 itself is self-biased, with its operating current being derived from its output voltage in order to cancel out its input offset. FIG. 7 depicts one exemplary embodiment. As indicated, the amplifier output is coupled to the Vbp bias node (FIGS. 4-6). The negative amplifier input is feedback-coupled with the charge pump output Vcntl, while the other input (positive) is feedback-coupled with the output of replica charge pump 104 and NMOS bias voltage Vbn. This is but one exemplary embodiment. According to various alternate embodiments, additional differential amplifiers are employed (e.g., to feed NMOS bias input Vbn, by comparing the charge pump output with the PMOS bias voltage Vbp), in addition to or instead of amplifier 102.

The feedback topology of charge pump 106, charge pump replica 104 and differential amplifier 102 automatically and dynamically biases the charge pump current sources, typically without reference to any external fixed level. For example, if Vbn is less than Vcntl, the output voltage of differential amplifier 102 will drop, thus reducing the PMOS bias voltage Vbp further below Vdd until the output of the charge pump replica rises to equal Vcntl. Conversely, if Vbn is greater than Vcntl, the output of differential amplifier 102 will rise until the feedback mechanism produces a PMOS bias voltage Vbp at which the charge pump replica output is equal to the stored charge pump output Vcntl. In other words, the amplifier adjusts the PMOS bias voltage Vbp so that the diode-connected NMOS device (e.g. transistors 134 and 136, because Vbn is tied to OUT) produces Vcntl at its gate and drain.

The charge pump replica is thus automatically and dynamically biased so that its output tracks the Vcntl output of charge pump 106. Also, as previously discussed, the charge pump replica is configured, via device matching and the tied gate voltages of transistors 132 and 134, to replicate the current pathway of charge pump 106 when both the UP and DOWN signals are asserted. Since the corresponding devices (current sources) of charge pump 106 are commonly biased, the charge pump is automatically and dynamically biased to have its output remain substantially constant (i.e., not net charge pumped) when both the UP and DOWN signals are asserted. In other words, when the UP and DOWN inputs of the actual charge pump are both asserted, it will mirror the operation of charge pump replica 104 and produce no net charge at its Vcntl output. Accordingly, control is exerted over edge alignments during lock, and/or within a pre-defined dead band range, in order to minimize or eliminate static phase offset and wandering alignment when the DLL system is in lock.

As previously indicated, the current source transistors (110, 112, 124, 126, 130 and 136) typically are operated in the saturation region. Each can thus function as a current source independent of common-mode voltage excursions on the nodes above/below.

Within amplifier 102, transistors 160 and 162 (FIG. 7) typically will be operated in saturation as well, to provide maximum gain. Increased gain increases response time of the feedback system, so that the replica feedback biased charge pump minimizes the static phase offset of the DLL.

Referring still to exemplary amplifier 102 (FIG. 7), NMOS bias voltage Vbn is tied to transistor 160, which is in series with transistor 164. Let us suppose that the gate-to-source voltage of amplifier transistors 160, 162 and 164 is equal to Vgs when the inputs of the amplifier are equal, since transistor 164 is twice the size of transistors 160 and 162. In order to prevent device 164 from entering linear region, the voltage at the node above the transistor should be at least Vgs−Vt. It can be set to exactly Vgs−Vt with the correctly established current densities. This relationship may be converted into a constraint on the relative transistor sizing, as follows:

$$Vbn = Vgs + (Vgs - Vt)$$

$$Vbn - Vt = 2*(Vgs - Vt)$$

$$(Vbn - Vt)^2 = 4*(Vgs - Vt)^2$$

When a transistor is in saturation, current density (current/device area) is proportional to gate-to-source voltage, minus the threshold voltage, squared:

$$J = \sim (Vgs-Vt)^2$$

Thus, in the present example, the current density in transistors 164, 160 and 162 must be ¼ of the current density in transistors 124, 126 and 136, which are all biased by Vbn.

This current density ratio may be assured by the relative sizes of devices 112, 166, 168, 160, 162 and 164. First, note that the current through device 112 will equal the current through device 126 when the charge pump is not pumping charge. Because devices 112 and 166 both act as PMOS current sources in saturation region, are both biased by Vbp, and have a 4:1 width ratio, the current through 166 will be ¼ of the current through 112. Devices 168 and 164 act as an NMOS current mirror, so that the current through device 164 will be twice that through device 168, and thus half of that through device 126. The current through device 164 splits in two, so that the current through devices 160 and 162 is one-fourth of that through device 126.

Thus devices 164, 160 and 162 have one-fourth the current density of device 126, so that all devices will stay in saturation in all bias conditions, which is desired in the present example.

The above-described amplifier configuration is but one example of a specific implementation. Many other configurations may be employed in the feedback self-biasing arrangement described above.

Figure 8:
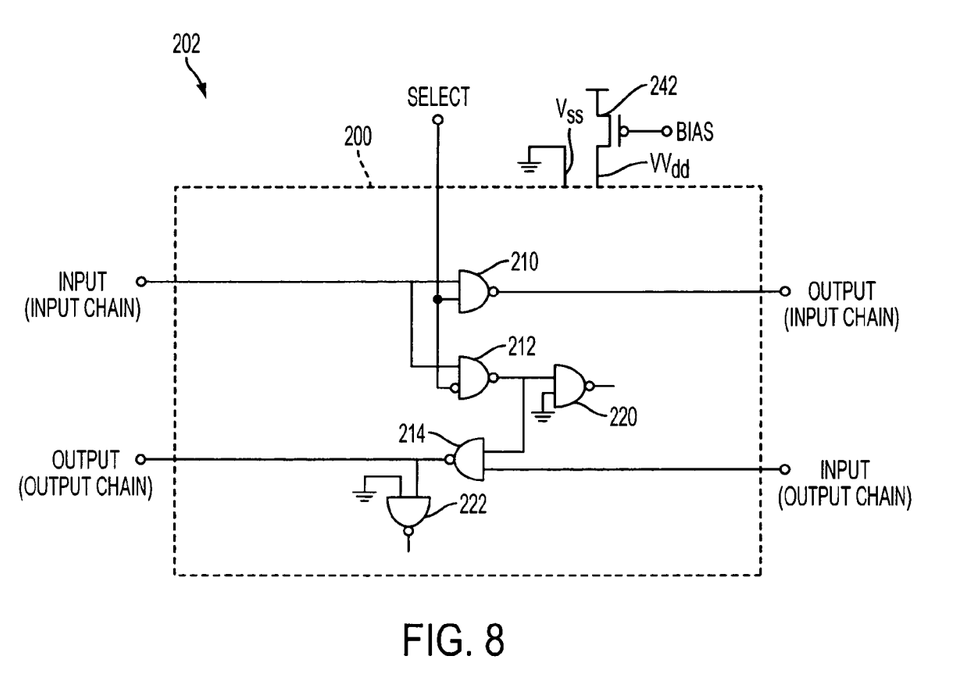
FIG. 8 is a schematic depiction showing one delay element embodiment of a delay line that potentially includes multiple delay elements.

FIG. 8 shows an exemplary delay element 200 in a delay line 202 according to the present description. The delay lines of the present description typically include multiple delay elements 200. In the present example, the delay element includes a plurality of logic gates (NAND gates) which serve to delay signals, such as a reference clock, passing through the delay line. The logic gates are powered by upper voltage VVdd and lower or substrate voltage Vss. VVdd may be a regulated supply voltage, as explained in more detail below.

The delay elements 200 are enabled via a select input, such as from a decoder, as described above with reference to FIG. 3. In the present embodiment, the delay element after the one with the wrap leg selected also has the wrap leg selected, so as to force a high into the output chain input of the first selected wrap delay element. The status of the select inputs determines the length of the input chain and output chain (i.e., the number of delay elements the signal passes through). In a first state, the select input will enable the delay element, so that the propagating signal continues through gate 210 to the right along the input chain (to the next delay element). In the other state, the signal is wrapped down through gates 212 and 214 to the output chain, and then propagates to the left through all of the delay elements to the left that the signal passed through during its propagation along the input chain. Thus, the signal in the delay line may pass along an input chain containing N delay elements, and then at the N+1 delay element, the select signal may cause the signal to wrap around and then propagate back through gate 214 of each prior delay element.

The select signals from the decoder thus determine the number of activated delay elements through which the signal travels. As discussed in more detail below, the speed of each delay element is determined in part by the regulated supply voltage VVdd. The delay of the delay line is thus a function of the regulated supply voltage and the number of activated elements in the line.

Dummy loads may be employed within delay line 202. In the present example, dummy loads are implemented within each delay element as gates 220 and 222. This may be employed to ensure that every NAND gate in the delay line sees a substantially identical load. Thus, no matter how many delay stages/elements are selected, both rising and falling input edges travel through an equal number of rising and falling transitions through identically-loaded NAND gates. In certain applications, this property reduces pulse width distortion and improves linearity of delay with respect to number of stages selected.

Figure 9:
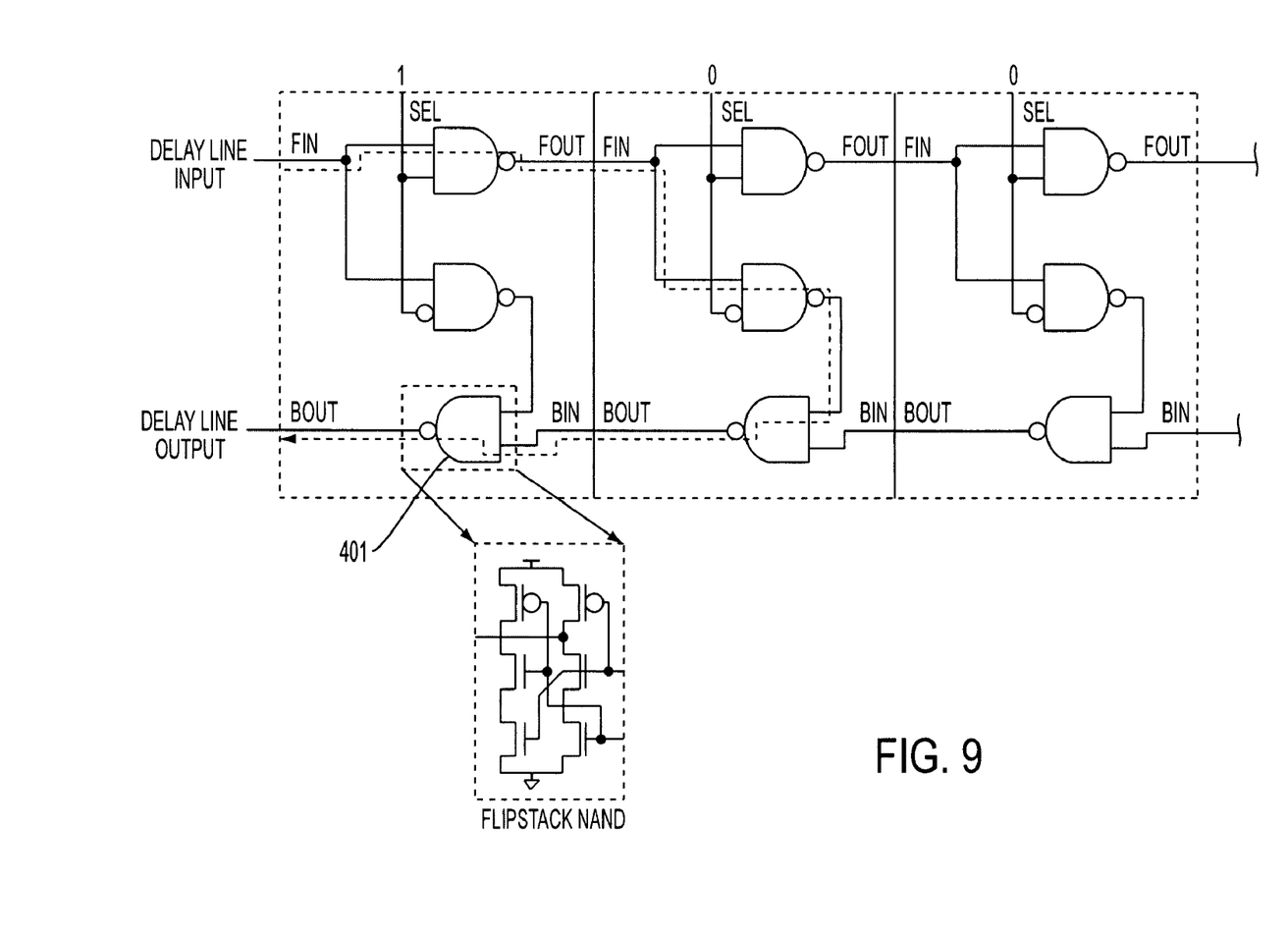
FIG. 9 is a schematic depiction of two delay elements within a delay line, depicting the connections between the delay elements and a flip-stack implementation of a NAND gate.

Referring now to FIG. 9, certain CMOS NAND gates have asymmetrical inputs. Because the signal passes through the wrap (upper) leg of NAND gate 401 in just one location on the delay line (i.e. the delay element at which the signal is wrapped to the output chain), if a standard CMOS NAND were used here it would cause at least one gate in the path to see a different loading and delay environment than the rest, which could introduce pulse width distortion. Instead, flip-stack NANDs may be used, as indicated in FIG. 9. The symmetrical inputs enable every gate in the chain to see substantially identical loading and delay. Use of a symmetrical logic gate such as a flip-stack NAND may also minimize the delay in each element (thus providing higher resolution), and may avoid distorting rising and falling edges differently.

In order to maximize resolution, it may be desirable to minimize the delay of each delay line element 200. It is also desirable in many cases to maintain equal delays for rising and falling edges. To ensure constant current dissipation, the delay line stage selected to wrap the edge to the output chain must also prevent the edge from traveling any further along the input chain. Otherwise there would be two edges in the delay line simultaneously and current dissipation would double. According to one example, a CMOS NAND is employed to rapidly MUX the wrapped edge and kill the forward edge. By using the same gate for both functions, the delay line can avoid propagating rising and falling edges through different circuit structures, and thus distorting the two edges differently. The resulting delay stage is inverting along both the input chain and output chain. Because each additional selected stage adds two inverting gates to the chain, the overall delay line is always noninverting.

Figure 10:
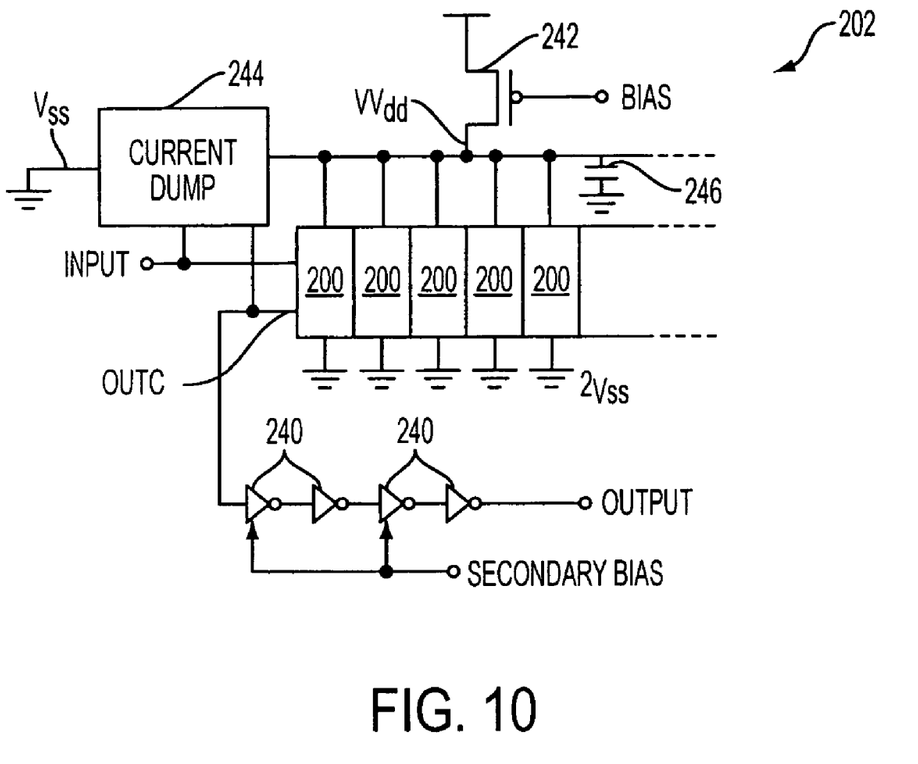
FIG. 10 is a schematic depiction of a further embodiment of a delay line according to the present description.

Referring now to FIG. 10, further exemplary aspects of delay line 202 will be described. It will be appreciated that the delay line features discussed herein may be employed in connection with the above-described master or slave delay lines, or with other delay lines in a DLL system. Delay line 202 may include a plurality of delay elements, which may be similar to those described above with reference to FIG. 8. The delay elements are driven by supply voltages Vss and regulated supply voltage VVdd. The input signal is applied to the beginning of the chain of delay elements. The signal passes through a number of elements which depends on the status of the select signals (not shown in FIG. 10), and then passes through the output of the chain of delay elements. Additional, selective delay may be added via additional delay elements 240. The initial output from the first chain of delay elements is designated in the figure as "outc," with the ultimate output of the delay line being designated as "output."

PMOS device 242 acts as a delay regulator to control a current/voltage applied to delay elements 200. More particularly, device 242, acting as a current source, controls VVdd supply current directly, and because the delay line acts as a constant impedance, device 242 controls the voltage on VVdd as well. This, in turn, controls the speed of the logic gates and thus the amount of signal delay for the delay element. As shown in FIG. 10, a single biased current source may be used to supply operating current/voltage to all of the delay elements 200. The bias input to device 242 typically is generated by bias generator 44, in response to output from charge pump system 40 and filter 42.

Device 242 acts as a biased current source to node VVdd. If the circuit supplied by VVdd dissipates current intermittently (for example, only while an edge is propagating through the delay line), current source 242 must turn on and off. The transitions between the on and off states are not instant and will affect the delays of the first and last delay elements in ways that may be sensitive to supply and substrate noise.

In order to reduce this sensitivity, it is desirable to cause the delay line elements supplied by VVdd to dissipate constant current, and present a constant impedance. However, CMOS gates typically dissipate current only when their output changes state. Thus a line of delay elements using CMOS gates dissipates current only when an edge is in flight within the line of elements.

Figure 11:
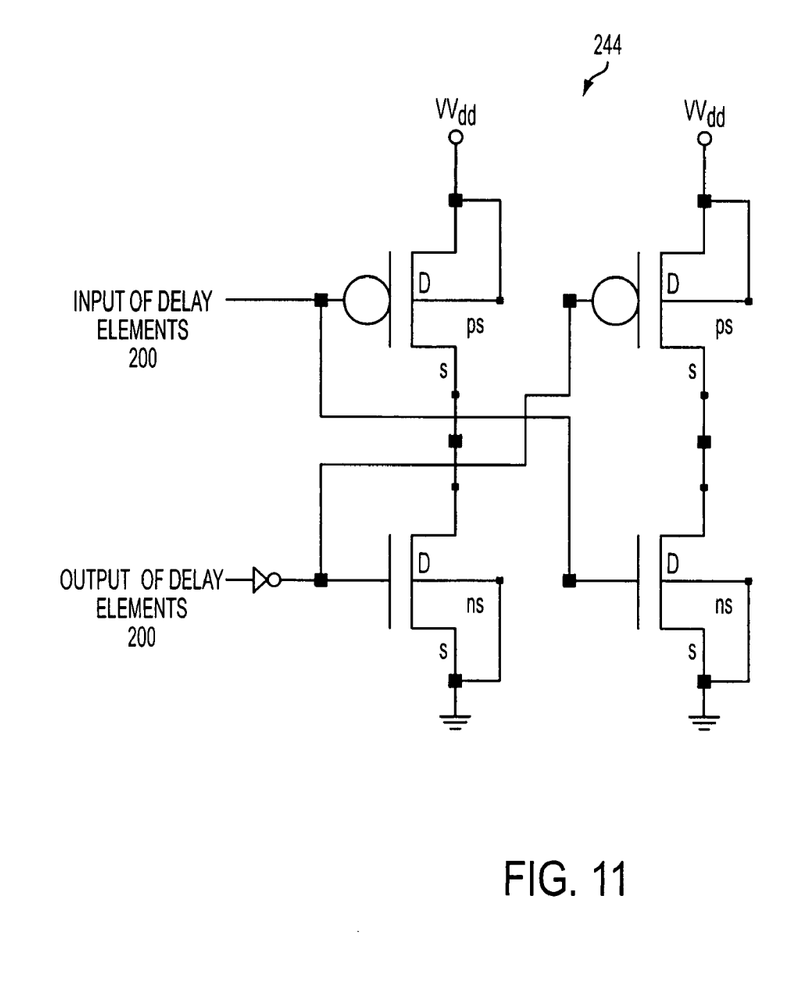
FIG. 11 is a schematic depiction of a current dump, a circuit for detecting an edge propagating within a delay line and conducting current depending on the presence or absence of such an edge.

Accordingly, a current dissipation circuit, such as current dump 244, may be implemented. Current dump 244 is configured to draw current from delay regulator 242 when an edge is not in flight within the line of delay elements 200. FIG. 11 depicts an exemplary implementation of a circuit for detecting when an edge is in flight within delay elements 200, and for drawing current from device 242 if no edge is in flight.

Referring particularly to FIG. 11, an XOR implementation may be employed, in which current dump 244 only draws current if no edge is present within the line of delay elements 200. In particular, if the input and OUTC of delay elements 200 have different values (e.g., one is high and the other low), then it is determined that an edge is in flight or present within the line of delay elements 200. Accordingly, logic gates within the line of delay elements are drawing current from device 242. In this state, neither of the transistor stacks shown in FIG. 11 are conducting, and current is thus not drawn by current dump 244 from delay regulator 242.

Conversely, if the input and OUTC are at the same level (no edge in flight), the XOR implementation of FIG. 11 enables a circuit mirroring the logic gates that sinks a constant current through one of the transistor stacks which replicates the current sunk by the delay line when an edge is in flight. With this current compensation circuit, the current dissipation is more nearly constant, thus the voltage VVdd is more nearly constant. This creates a more linear delay response and keeps the semiconductor devices within delay elements 200 closer to their optimal bias point. This also reduces supply and substrate noise sensitivity, and may eliminate or reduce jitter. Furthermore, a small capacitor 246 on VVdd can filter the very high frequency impedance variation from successive gates switching, so that the impedance and thus voltage on VVdd remains more nearly constant. Thus, the delay of the various delay elements 200 within the delay line is better matched, and the delay of the delay line is less sensitive to supply and substrate noise, which will reduce jitter.

In addition, rather than the two current dump paths of FIG. 11, an alternate implementation of the current dump could employ an explicit XOR gate enabling a single current dump path.

It will be appreciated that the resolution of a delay line is often limited by the delay of each delay element. Finer resolution may be attained in any of the examples herein through interpolative methods. Specifically, finer resolution may be attained by using the outputs of two consecutive delay elements (e.g., two adjacent delay elements 200) and interpolating an output signal from these outputs.

In certain settings, it can be difficult to make a delay line that delays rising and falling edges identically. If the edge types are delayed differently, the delay lines may distort the pulse width of the input signal, which can be undesirable. To correct this problem, a secondary control loop may be added, as shown in FIG. 12.

Figure 12:
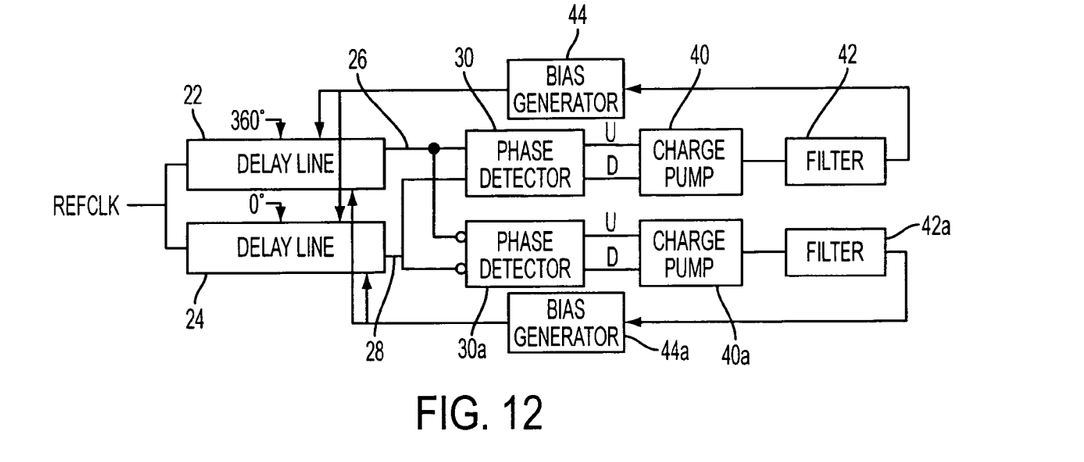
FIG. 12 depicts another embodiment of a DLL system according to the present description, including a secondary control loop for providing delay adjustments for an opposite edge type.

The DLL of FIG. 12 includes a primary or main control loop as previously described, including phase detector 30, charge pump system 40, filter 42 and bias generator 44. The secondary control loop includes phase detector 30a, charge pump system 40a, filter 42a and bias generator 44a. The components of the secondary control loop operate similarly to those of the main control loop but on the opposite edge type, as indicated by the inverters on the inputs of phase detector 30a. For example, the primary loop may be configured to perform phase detection and delay control on rising edges from the delay lines, with the secondary control loop operating on falling edges.

Except as otherwise indicated or described, the components of the secondary control loop operate similarly to those of the master control loop.

The secondary control loop includes a phase detector 30a that receives an inverted reference clock signal (via delay line 24) and the output of delay line 22. Typically, a inverted reference edge is compared against the previous inverted reference edge after being delayed by a full reference cycle through delay line 22.

Charge pump system 40a receives up and down outputs from phase detector 30a and produces a charge output proportional to the pulse width on the up or down outputs for loop filter 42a. Other schemes might produce a fixed charge rather than a proportional charge to the phase difference between the reference and delay line output signals.

A loop filter capacitor of loop filter 42a may store the current extra delay value as a second control voltage. This voltage is proportional to the time integral of the error charge signal from charge pump system 40a.

Bias generator 44a converts the second control voltage into a second bias level for the extra adjustment to be applied to edges of a specific type (falling edges in the present example). Secondary adjustment may be applied to one or more delay elements in the input or output of the delay chain, as in the preferred embodiment. They can also be applied to all alternating gates (not delay elements) of the delay chain, by coupling every other gate to a secondary current source VVdd2. In this latter case, the secondary control loop can operate on delayed falling edges through the two delay lines. In such a case, the falling edge adjustment circuit will have more of an impact on the 360° delay line due to the larger number of selected secondary adjustment stages.

Figure 13:
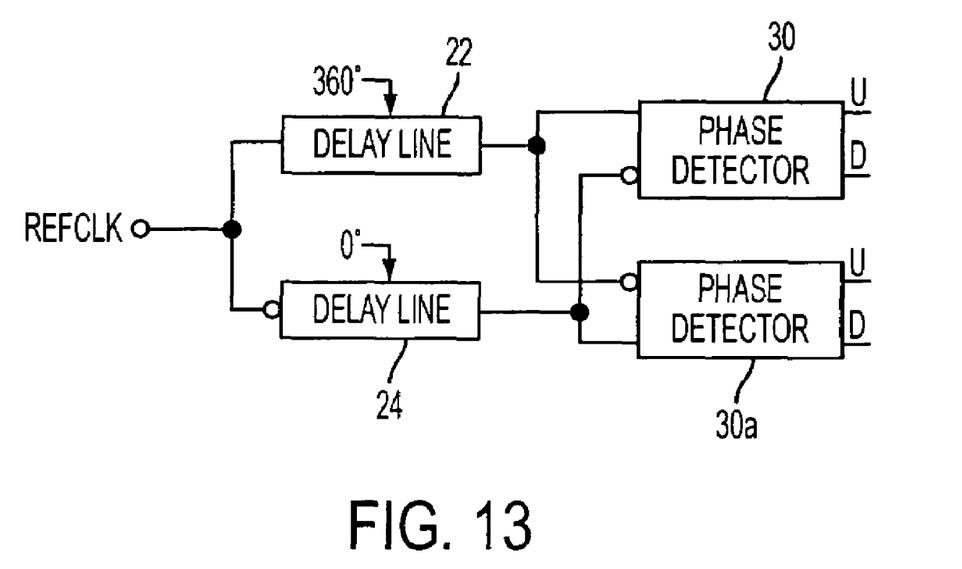
FIG. 13 depicts an alternate implementation of a portion of the DLL system shown in FIG. 12.

However, in the former case, both delay lines will adjust falling edges the same way which will likely lead to control problems in the secondary loop as the loop gain will be small and possibly negative. This issue may be resolved, as shown in FIG. 13 (depicting an alternate implementation of a portion of FIG. 12), by inverting the edge at the input of the 0° delay line and inverting again after the 0° delay line, and by ensuring that the bandwidths of the primary and secondary control loops are significantly different. According to one example embodiment, the primary loop has higher bandwidth, in which case the primary control loop will still operate as described above since it sees the falling edge delay adjustment as relatively constant, and will adjust to a lock point given the state of the falling edge correction circuit.

Note that the inputs to the secondary phase detector in FIG. 13 are opposite those of the primary phase detector, so that the secondary phase detector triggers off edges derived from falling refclk edges.

With this configuration, the falling edge adjustment will only be observed by the secondary control loop in the 0 deg delay line so that the gain of the secondary control loop will be well defined. It should be appreciated that the added inverters in the bath of both delay lines should be matched so that their added delays are identical.

This second bias level is indicated as "secondary bias" in FIG. 10. As indicated, the secondary bias level may be applied to alternate ones of delay elements 240, to adjust the delay of the falling input edges more than the delay of rising input edges, in response to the secondary bias level generated by the secondary control loop.

It will be appreciated that the embodiments and method implementations disclosed herein are exemplary in nature, and that these specific examples are not to be considered in a limiting sense, because numerous variations are possible. The subject matter of the present disclosure includes all novel and nonobvious combinations and subcombinations of the various features, functions, and/or properties disclosed herein. The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

What is claimed is:

1. A delay-locked loop, comprising:
    a phase detector configured to receive two signals, one of the signals being delayed relative to the other of the signals, the phase detector having an UP output and a DOWN output;
    a charge pump system operatively coupled with the phase detector and including:
        a charge pump configured to be responsive to assertion of actuating signals from the UP output and the DOWN output so as to control pumping of charge from the charge pump system, such pumped charge being usable to control a delay line carrying one of the two signals, so as to control relative delay occurring between the two signals; and
        a feedback control loop configured to dynamically adjust at least one bias signal at the charge pump so as to minimize net charge pumped from the charge pump system during simultaneous assertion of actuating signals from the UP output and the DOWN output;
    a delay regulator coupled to the delay line and adapted to supply a current-dependent regulated supply voltage to power semiconductor devices of the delay line; and
    a current compensation circuit coupled to the delay regulator and configured to operate in one of an activated state, in which the current compensation circuit draws current from the delay regulator, and a deactivated state, in which the current compensation circuit draws substantially no current from the delay regulator.

2. The delay-locked loop of claim 1, where the phase detector is coupled to two delay lines, with the delay-locked loop being configured to lock the relative delay between the two delay lines to one reference cycle.

3. The delay-locked loop of claim 1, where the charge pump includes:
    a first switch coupled with a first current source and configured to be actuated via assertion of an actuating signal from the UP output; and
    a second switch coupled with a second current source and configured to be actuated via assertion of an actuating signal from the DOWN output, the charge pump being adapted so that biasing of the current sources and actuation of the switches controls pumping of charge from the charge pump system.

4. The delay-locked loop of claim 3, where the feedback control loop includes a charge pump replica, the charge pump replica having:
    a first switch coupled with a first current source, the first switch and the first current source of the charge pump replica being matched to the first switch and the first current source of the charge pump; and
    a second switch coupled with a second current source, the second switch and the second current source of the charge pump replica being matched to the second switch and the second current source of the charge pump.

5. The delay-locked loop of claim 4, where the first current source of the charge pump and the first current source of the charge pump replica are commonly biased, and where the second current source of the charge pump and the second current source of the charge pump replica are commonly biased.

6. The delay-locked loop of claim 5, where the first switch and the second switch of the charge pump replica are tied closed.

7. The delay-locked loop of claim 6, where an output of the charge pump is fed back through a differential amplifier to bias at least one of the first current sources and the second current sources, thereby dynamically generating a bias condition in which an output of the charge pump replica converges to an output of the charge pump.

8. The delay-locked loop of claim 1, further comprising a flip-stack NAND gate in each delay element of the delay line.

9. The delay-locked loop of claim 1, where the current compensation circuit is configured to operate in the activated state when substantially no current is being drawn from the delay regulator by the delay line.

10. The delay-locked loop of claim 9, where the current compensation circuit is configured so that, in the activated state, it draws current substantially equivalent to that drawn by the delay line when a signal edge is propagating through the delay line.

11. The delay-locked loop of claim 1, where the current compensation circuit is configured to operate in the deactivated state when a signal edge is propagating through the delay line.

12. The delay-locked loop of claim 1, further comprising first and second control loops, the first control loop being configured to control relative delay occurring between the two signals based on phase offset detection between rising edges of the two signals, the second control loop being configured to control relative delay occurring between the two signals based on phase offset detection between falling edges of the two signals.

13. A delay-locked loop, comprising:
    a first delay line;
    a second delay line;
    a phase detector coupled to outputs of the first and second delay lines, the phase detector including an UP output and a DOWN output;
    a charge pump coupled to the phase detector so that the UP output of the phase detector is coupled to a first charge pump input and so that the DOWN output of the phase detector is coupled to a second charge pump input, where the charge pump is configured to pump charge via a charge pump output based on a bias condition and on levels at the first charge pump input and the second charge pump input;

a charge pump replica coupled with the charge pump and configured to dynamically adjust the bias condition so that, in response to an assertion condition at the first charge pump input and the second charge pump input, the charge pump pumps a net charge that tends toward a desired value associated with such assertion condition;

a delay regulator coupled to at least one of the delay lines and adapted to supply a current-dependent regulated supply voltage to power semiconductor devices of said delay line; and a current compensation circuit coupled to the delay regulator and configured to operate in one of an activated state, in which the current compensation circuit draws current from the delay regulator, and a deactivated state, in which the current compensation circuit draws substantially no current from the delay regulator.

14. The delay-locked loop of claim 13, where the assertion condition is a simultaneous assertion of activating signals at the first charge pump input and the second charge pump input.

15. The delay-locked loop of claim 14, where the desired value is substantially zero net charge.

16. The delay-locked loop of claim 13, where the charge pump and the charge pump replica each have a first common bias input and a second common bias input.

17. The delay-locked loop of claim 16, where the charge pump output and a charge pump replica output are coupled to a differential amplifier, and where an output of the differential amplifier biases at least one of the first common bias input and the second common bias input.

18. The delay-locked loop of claim 16, where the charge pump output and a charge pump replica output are operatively coupled to the first common bias input and the second common bias input.

19. The delay-locked loop of claim 13, where the current compensation circuit is configured to operate in the activated state when substantially no current is being drawn from the delay regulator by said delay line.

20. The delay-locked loop of claim 19, where the current compensation circuit is configured so that, in the activated state, it draws current substantially equivalent to that drawn by said delay line when a signal edge is propagating through said delay line.

21. The delay-locked loop of claim 13, where the current compensation circuit is configured to operate in the deactivated state when a signal edge is propagating through said delay line.

22. The delay-locked loop of claim 13, further comprising first and second control loops, the first control loop being configured to control relative delay occurring between the first and second delay lines based on phase offset detection between rising edges output from the first and second delay lines, the second control loop being configured to control relative delay occurring between the first and second delay lines based on phase offset detection between falling edges output from the first and second delay lines.

* * * * *

UNITED STATES PATENT AND TRADEMARK OFFICE
CERTIFICATE OF CORRECTION

PATENT NO. : 7,634,039 B2 Page 1 of 1
APPLICATION NO. : 11/347835
DATED : December 15, 2009
INVENTOR(S) : Maneatis et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 832 days.

Signed and Sealed this

Ninth Day of November, 2010

David J. Kappos
*Director of the United States Patent and Trademark Office*